(12) United States Patent
Moers et al.

(10) Patent No.: US 9,601,310 B2
(45) Date of Patent: Mar. 21, 2017

(54) CHARGED PARTICLE MICROSCOPE WITH BAROMETRIC PRESSURE CORRECTION

(71) Applicant: FEI Company, Hillsboro, OR (US)

(72) Inventors: Marco Hugo Petrus Moers, Best (NL); Albert Visscher, Veldhoven (NL)

(73) Assignee: FEI COMPANY, Hillsboro, OR (US)

( * ) Notice: Subject to any disclaimer, the term of this patent is extended or adjusted under 35 U.S.C. 154(b) by 0 days.

(21) Appl. No.: 14/938,689

(22) Filed: Nov. 11, 2015

(65) Prior Publication Data

US 2016/0133437 A1    May 12, 2016

(30) Foreign Application Priority Data

Nov. 12, 2014   (EP) .................... 14192805

(51) Int. Cl.
  *H01J 37/26*    (2006.01)
(52) U.S. Cl.
  CPC .................. *H01J 37/265* (2013.01)
(58) Field of Classification Search
  USPC ............... 250/305, 306, 307, 309, 310, 311
  See application file for complete search history.

(56) References Cited

U.S. PATENT DOCUMENTS

| | | | | |
|---|---|---|---|---|
| 5,424,552 A * | 6/1995 | Tsuji | ................... | G03F 7/70241 250/548 |
| 2006/0076492 A1 | 4/2006 | Taniguchi et al. | | |
| 2008/0011965 A1 | 1/2008 | Matsukawa et al. | | |
| 2013/0284924 A1* | 10/2013 | Mizuochi | ........... | G01N 23/2206 250/310 |
| 2015/0371814 A1* | 12/2015 | Kanno | .................... | H01J 37/20 250/443.1 |
| 2016/0033355 A1* | 2/2016 | Gardiner | ................ | G01M 3/26 700/283 |

FOREIGN PATENT DOCUMENTS

| | | |
|---|---|---|
| JP | 2004055300 | 2/2004 |
| JP | 2005235603 | 9/2005 |

OTHER PUBLICATIONS

"Electron Microscope", Wikipedia, Accessed Oct. 15, 2015, 11 pages. <https://en.wikipedia.org/wiki/Electron_microscope>.
"Scanning Electron Microscope", Wikipedia, Accessed Oct. 15, 2015, 18 pages. <https://en.wikipedia.org/wiki/Scanning_electron_microscope>.
"Transmission Electron Microscopy", Wikipedia, Accessed Oct. 15, 2015, 23 pages. <https://en.wikipedia.org/wiki/Transmission_electron_microscopy>.

(Continued)

*Primary Examiner* — Nicole Ippolito
(74) *Attorney, Agent, or Firm* — Scheinberg & Associates, P.C.; Michael O. Scheinberg

(57) ABSTRACT

A method of mitigating the effects of environmental pressure variation while using a charged particle microscope is described. The charged particle microscope equipped with a barometric pressure sensor and an automatic controller configured to use the signal from the barometric sensor as an input to a control procedure to compensate for a relative positional error between the charged particle beam and the specimen holder.

20 Claims, 8 Drawing Sheets

(56) References Cited

OTHER PUBLICATIONS

"Scanning Transmission Electron Microscopy", Wikipedia, Accessed Oct. 15, 2015, 5 pages. <https://en.wikipedia.org/wiki/Scanning_transmission_electron_microscopy>.

"Scanning Helium Ion Microscope", Wikipedia, Accessed Oct. 15, 2015, 2 pages. <https://en.wikipedia.org/wiki/Scanning_Helium_Ion_Microscope>.

W. H. Escovitz et al., "Scanning Transmission Ion Microscope with a Field Ion Source", Proc. Nat. Acad. Sci. USA, vol. 72, No. 5, pp. 1826-1828, May 1975, 3 pages.

* cited by examiner

CHARGED PARTICLE MICROSCOPE WITH BAROMETRIC PRESSURE CORRECTION

The invention relates to a method of using a Charged Particle Microscope, comprising the following steps:
Providing a specimen on a specimen holder;
Directing a beam of charged particles from a source through an illuminator so as to irradiate the specimen;
Using a detector to detect a flux of radiation emanating from the specimen in response to said irradiation.

The invention correspondingly relates to a Charged Particle Microscope comprising:
A specimen holder, for holding a specimen;
A source, for producing a beam of charged particles;
An illuminator, for directing said beam so as to irradiate the specimen;
A detector, for detecting a flux of radiation emanating from the specimen in response to said irradiation.

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:

In a SEM, irradiation of a specimen by a scanning electron beam precipitates emanation of "auxiliary" radiation from the specimen, in the form of secondary electrons, backscattered electrons, X-rays and photoluminescence (infrared, visible and/or ultraviolet photons), for example; one or more components of this flux of emanating radiation is/are then detected and used for image accumulation purposes.

In a TEM, the electron beam used to irradiate the specimen is chosen to be of a high-enough energy to penetrate the specimen (which, to this end, will generally be thinner than in the case of a SEM specimen); the flux of transmitted electrons emanating from the specimen can then be used to create an image. When such a TEM is operated in scanning mode (thus becoming a STEM), the image in question will be accumulated during a scanning motion of the irradiating electron beam.

More information on some of the topics elucidated here can, for example, be gleaned from the following Wikipedia links:
http://en.wikipedia.org/wiki/Electron_microscope
http://en.wikipedia.org/wiki/Scanning_electron_microscope
http://en.wikipedia.org/wiki/Transmission_electron_microscopy
http://en.wikipedia.org/wiki/Scanning_transmission_electron_microscopy As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance. As regards ion-based microscopy, some further information can, for example, be gleaned from sources such as the following:

http://en.wikipedia.org/wiki/Scanning_Helium_Ion_Microscope

W. H. Escovitz, T. R. Fox and R. Levi-Setti, *Scanning Transmission Ion Microscope with a Field Ion Source*, Proc. Nat. Acad. Sci. USA 72(5), pp. 1826-1828 (1975).

It should be noted that, in addition to imaging, a charged particle microscope may also have other functionalities, such as performing spectroscopy, examining diffractograms, performing (localized) surface modification (e.g. milling, etching, deposition), etc.

In all cases, a Charged Particle Microscope (CPM) will comprise at least the following components:
A radiation source, such as a Schottky electron source or ion gun.
An illuminator, which serves to manipulate a "raw" radiation beam from the source and perform upon it certain operations such as focusing, aberration mitigation, cropping (with an aperture), filtering, etc. It will generally comprise one or more (charged-particle) lenses, and may comprise other types of (particle-) optical component also. If desired, the illuminator can be provided with a deflector system that can be invoked to cause its output beam to perform a scanning motion across the specimen being investigated.
A specimen holder, on which a specimen under investigation can be held and positioned (e.g. tilted, rotated). If desired, this holder can be moved so as to effect scanning motion of the beam w.r.t. the specimen. In general, such a specimen holder will be connected to a positioning system such as a mechanical stage.
A detector (for detecting radiation emanating from an irradiated specimen), which may be unitary or compound/distributed in nature, and which can take many different forms, depending on the radiation being detected. Examples include photomultipliers (including solid state photomultipliers, SSPMs), photodiodes, CMOS detectors, CCD detectors, photovoltaic cells, etc., which may, for example, be used in conjunction with a scintillator film, for instance.

In the case of a transmission-type microscope (such as a (S)TEM, for example), the CPM will also comprise:
An imaging system, which essentially takes charged particles that are transmitted through a specimen (plane) and directs (focuses) them onto analysis apparatus, such as a detection/imaging device, spectroscopic apparatus (such as an EELS module), etc. As with the illuminator referred to above, the imaging system may also perform other functions, such as aberration mitigation, cropping, filtering, etc., and it will generally comprise one or more charged-particle lenses and/or other types of particle-optical components.

In what follows, the invention may—by way of example—sometimes be set forth in the specific context of electron microscopy. However, such simplification is intended solely for clarity/illustrative purposes, and should not be interpreted as limiting.

Although known CPMs produce tolerable imaging results, there is always room for improvement. In that context, the current inventors have worked extensively to identify shortcomings in conventional CPM designs, and to address these effectively so as to produce improved CPM performance. The results of such endeavor are the subject of the current application.

It is an object of the invention to provide an improved method of using a charged particle microscope as referred to above. In particular, it is an object of the invention that such a method should yield improved imaging results compared to conventional methods.

These and other objects are achieved in a method as set forth in the opening paragraph above, characterized by the following steps:

Providing the microscope with a barometric pressure sensor;

Providing an automatic controller with a pressure measurement signal from said barometric pressure sensor;

Invoking said controller to use said signal as input to a control procedure, to compensate for a relative positional error of said beam and said specimen holder on the basis of said signal.

They are correspondingly achieved in a microscope as set forth in the second opening paragraph above, characterized in that:

The microscope comprises:
An automatic controller, and;
An input interface from a barometric pressure sensor, which can supply a pressure measurement signal to said controller;

Said controller can be invoked to use said signal as input to a control procedure, to compensate for a relative positional error of said beam and said specimen holder on the basis of said signal.

For good order, the following points should be noted with regarded to certain aspects of the terminology used to elucidate the current invention:

(a) The barometric pressure sensor may, for example:
Be located adjacent to the specimen holder, e.g. at/proximal an externally protruding portion (such as a positioning mechanism) of the holder;
Be mounted on an exterior surface/frame of the microscope, somewhat removed from the specimen holder (e.g. within 50-100 cm of it);
Be somewhat distanced from the microscope, but still be in barometric communication therewith, e.g. it might be located in a confined space (such as a room or cabin) containing the microscope and positioned so as to be vicinal thereto (e.g. within 5-10 meters of it);
Be shared by/connected to a plurality of microscopes, e.g. it might be located in a relatively central position in a room containing several microscopes, and be connected to one or more of these via a signal carrier such as an electrical cable, optical fiber, etc.

(b) The automatic controller may have a unitary or compound nature, and may, for example, comprise a group of cooperating sub-controllers, each of which can be assigned specific sub-tasks. It may, for instance, be a specifically designed analog or digital electronic circuit, or it may comprise (part of) a computer processor, which can execute commands written in software/firmware. It may be part of a master controller used to generally coordinate automated processes within the CPM, or it may be a dedicated device.

(c) The CPM is provided with the measurement functionality offered by the pressure sensor via said input interface. Such an interface may, for example, comprise:
A signal carrier connected to the pressure sensor;
A jack/socket to which an external pressure sensor can be connected via a signal carrier;
A bus (data cable) for carrying data from an external computer to which the pressure sensor is connected, etc.

In experiments leading to the invention, the inventors performed high-resolution STEM imaging investigations on crystalline specimens—such as silicon <110> and graphene—each comprising a regular lattice of atoms. Because such specimens intrinsically comprise an essentially perfect, repetitive array of structural units, one might expect a CPM image thereof to be equally perfect. In practice, however, the inventors observed many imperfections in such imagery, typically in the form of apparent lattice mismatches, dislocations and linear faults (see arrowed zones of FIGS. 2A and 2B, for example). Because the specimen is essentially perfect, the origin of such imperfections was sought in the CPM itself. It was initially suspected that the imaging imperfections were being caused by parasitic vibrations of the CPM's machine frame, which were being conducted into the CPM through the ground, e.g. as a result of passing traffic; however, after exhaustive checks, this potential source was subsequently eliminated as a candidate cause of the observed anomalies. In a similar fashion, expansion/contraction behavior due to possible temperature fluctuations was also eliminated as a potential cause. Eventually, after extensive investigation, a temporal correlation was noted between the occurrence of jumps in the lattice imagery and the opening/closing of a sliding exterior door located tens of meters away from the CPM, and separated therefrom by various interior walls. Notably, when dedicated experiments were conducted to further investigate this effect, it was observed that opening and closing of the door in question could cause pressure fluctuations of the order of 10-15 pascals (Pa) at the location of an external actuator/suspension unit of the specimen holder, and that such fluctuations were enough to produce holder movements of the order of about 200 picometers (pm). This effect is illustrated, for example, in FIG. 3A, which shows:

A lower curve, representing atmospheric pressure variation (relative to a nominal pressure) measured at the location of said external actuator/suspension unit of the specimen holder, using a dedicated barometric pressure sensor. The graph shows a 115-second time interval, during most of which various degrees of anomalous jitter are measured. Of particular interest are the last 15 seconds, in which deliberate opening and closing of the abovementioned sliding door produced well-defined up-and-down variation of pressure, expressed here in Pa (see right vertical axis).

An upper black curve, showing relative displacements within an image of a Si <110> specimen (parallel to a given reference direction normal to the beam, and relative to a given reference position) in the same 115-second interval, and expressed in pm (see left vertical axis); such displacements manifest themselves as shifts in the imaged regular Si <110> lattice structure due to beam/specimen (holder) positional shifts, and can be regarded as an indicator of the latter. Note the clear correlation with the lower curve, which is rendered even clearer by inverting/scaling the lower curve and overlaying it on the black upper one, thereby yielding the grey dashed curve.

Once this correlation was established, the inventors went about tackling its effects. To this end, they developed control procedures that use a pressure signal from the pressure sensor to compensate for beam/specimen (holder) relative positional errors. More particularly:

(i) In a first approach, the inventors developed a control loop in which a signal from the employed pressure sensor was used as the basis for an on-the-fly correction of the relative position of specimen holder and charged-particle beam. More specifically, on the basis of, for example, a prior calibration routine (and/or a model of the influence of pressure changes on specimen holder position relative to the charged-particle beam), one can:
- Track pressure fluctuations using said barometric pressure sensor;
- Use these pressure measurements to calculate associated changes in said (relative) specimen holder position;
- Actively adjust said position on the basis of said calculations, so as to mitigate the effect of said fluctuating pressure.

(ii) In a second approach, the inventors developed an ex post facto correction with the following aspects:
- The microscope is provided with scanning means, for producing relative scanning motion of the beam and specimen;
- The controller is invoked to construct a table of detector output as a function of scan coordinate position on the specimen;
- Compensation comprises retrospective correction of said scan coordinate position on a point-by-point basis.

As indicated above, imaging in the case of a scanning-type microscope essentially occurs by accumulating the abovementioned table and converting its data entries into a two-dimensional plot of detector output versus coordinate position. The table itself basically corresponds to a set of data pairs $\{D_n, (x_n, y_n)\}$, accrued at a sequence of successive sampling/pixel points whose consecutive members have increasing values of ordinal n, where $D_n$ denotes detector output at coordinate position $(x_n, y_n)$. In the current embodiment, an output signal from the employed barometric pressure sensor—in conjunction with, for example, a prior calibration routine (and/or a model of the influence of pressure changes on specimen holder position relative to the charged-particle beam)—is used to calculate a positional error $(\Delta x_n, \Delta y_n)$ associated with each coordinate position $(x_n, y_n)$. One can then perform a corrective mapping/transformation of form:

$$(x_n, y_n) \rightarrow (x_n + \Delta x_n, y_n + \Delta y_n) = (x_n', y_n')$$

and assemble a corrected image on the basis of the adjusted data set $\{D_n, (x_n', y_n')\}$. In the current context, the stipulation "point-by-point" does not necessarily require each and every coordinate position to be individually corrected; instead, (more selective) corrections may also be performed on subsets/groups of coordinate positions at a time. In particular, the stipulation should be interpreted as encompassing a 'line-by-line" correction; this is because the frequency of the pressure variations dealt with by the current invention is typically relatively low compared to the line scanning frequency of the (raster) scanning motion generally employed in imaging, so that correction on a "per-line" basis may suffice.

Some exemplary results of compensation according to the present invention are illustrated in FIG. 3B, in which:
- The grey curve essentially represents uncorrected beam/specimen (holder) positional error, corresponding to the upper black curve of FIG. 3A;
- The black curve shows compensated holder position, using the lower curve of FIG. 3A as input to a control procedure as prescribed by the current invention—in this case a retrospective approach of type (ii) as referred to above. It is immediately obvious that this corrected black curve contains fewer and less extreme amplitude excursions than the uncorrected grey curve.

In a particular embodiment of a control loop approach as set forth in item (i) of the previous paragraph, the following applies:
- The specimen holder is provided with an actuator mechanism that can be used to adjust a position of the holder;
- The controller is invoked to adjust a position setpoint supplied to said actuator mechanism in response to said signal.

Said actuator mechanism will typically be able to position/move the specimen holder in multiple degrees of freedom, including both linearly (e.g. so as to choose a particular area for analysis on a specimen) and angularly (e.g. to achieve a particular specimen tilt relative to the irradiating beam). It may, for example, comprise a plurality of motors (e.g. piezoelectric or voice coil motors), pneumatic actuators, hydraulic actuators, etc. Motors are particularly advantageous in the context of the current invention because of their relatively fast response time and excellent positioning accuracy.

In an alternative or supplemental embodiment to that set forth in the previous paragraph, the following applies:
- The illuminator is provided with a deflector mechanism that can be used to adjust a deflection of the beam;
- The controller is invoked to adjust a deflection setpoint supplied to said deflector mechanism in response to said signal.

A deflector mechanism as referred to here may, for example, comprise one or more of:
- A magnetic beam deflection unit, which deflects a charged-particle beam using current-carrying coils;
- An electrostatic beam deflection unit, which deflects a charged-particle beam using capacitive plates.

In general, the former tend to lend themselves more to slower, larger-amplitude deflection, whereas the latter tend to lend themselves more to faster, smaller-amplitude deflection. In the case of a scanning-type microscope—such as a SEM or STEM, for example—such a deflector mechanism will generally be present anyway, for effecting scanning motion of the beam across the specimen; in such an instance, the deflector mechanism can then additionally be conveniently used to effect the on-the-fly positional corrections of the current embodiment.

In a different, but related, embodiment of the invention, the following applies:
- The microscope is provided with an imaging system, for directing a flux of charged particles transmitted through the specimen onto said detector;
- Said imaging system is provided with a steering module that can be used to adjust a path of said flux;
- The controller is invoked to adjust a steering setpoint supplied to said steering module in response to said signal.

This embodiment relates specifically to transmission-type microscopes—such as a (S)TEM—which comprise an imaging system in addition to the abovementioned illuminator. Just as with the illuminator, the particle-optical column of this imaging system can also comprise deflection apparatus—referred to here as a steering module—that can be used to steer (deflect, direct) a flux of charged particles passing through the imaging system. Once again, such a steering module may make use of magnetic and/or electrostatic deflection units as alluded to above.

In a particular embodiment of the present invention, use is made of a (high-pass) filter to discount effects of relatively low-frequency pressure variations associated with weather phenomena. Standard atmospheric pressure is defined to be 101325 Pa, but actual atmospheric pressure can easily vary between values of the order of 93 kPa (in a severe depression) tot 104 kPa (in a powerful anticyclone). Compared to the intermediate-frequency pressure fluctuations discussed above (e.g. of the order of about 0.1-100 Hz), such weather-related pressure variations are of a relatively low frequency (e.g. of the order of about $10^{-5}$-$10^{-4}$ Hz (corresponding to change on a timescale of hours or days)), and it is unnecessary/undesirable to correct for them, since their intra-image effect on a (relatively short) microscopic imaging session is negligible. Consequently, a (high-pass) filter can be used to discount them (choosing a cutoff for frequencies below about 0.01 Hz, for instance), e.g. as follows:

- By applying a filter in (a measurement circuit of) the barometric pressure sensor, so that such low-frequency fluctuations aren't even measured/registered;
- By applying a filter in the control procedure, whereby low-frequency components of the input signal (from the pressure sensor) are ignored/not used for positional compensation.

In a different, but nevertheless related, embodiment of the invention, use is made of a (low-pass) filter to discount effects of relatively high-frequency pressure variations associated with acoustic phenomena, e.g. sound in the human audible frequency range (ca. 20-20 kHz)—for instance as (relatively) constant ambient sound around the CPM caused by equipment, human activity/speech, etc. Above a certain frequency, the impact of such sound on the CPM is typically different than that of the intermediate-frequency fluctuations alluded to above (to which the invention is primarily directed). This is due to (generally disparate) resonant mechanical/dynamical behavior of different elements/subsystems in the CPM. To mitigate such behavior, use can be made of a (low-pass) filter to discount air pressure variation frequencies above (say) 100 Hz, for example.

As guidance values for cutoff (−3 dB) points in filters as referred to above, one can use the following exemplary ranges:

- A low-frequency cutoff point in the range 0.0001-0.1 Hz, preferably in the range 0.001-0.1 Hz, more preferably in the range 0.01-0.1 Hz;
- A high-frequency cutoff point in the range 8-100 Hz, preferably in the range 8-50 Hz, more preferably in the range 10-30 Hz.

To simultaneously achieve the effects set forth in the two preceding paragraphs, one can made use of a suitable bandpass filter. More information on various filtering techniques is given in Embodiment 5 below.

It should be noted that, in the context of the present invention, the relative positional error of the beam and specimen holder may be one- or multi-dimensional (depending inter alia on the structure and operation of the specimen holder) and the correction(s) applied thereto may also be one- or multi-dimensional (depending inter alia on what is considered (most) necessary/expedient, and on available space/resources, for example). Defining, for instance, a Cartesian coordinate system in which the beam nominally propagates along the Z direction and in which a (non-tilted) specimen nominally lies within the XY plane, the error encountered/corrected may have components in one or more of X, Y and Z. To give a specific example: the holder shown in FIG. 4A/4B was found to (predominantly) demonstrate positional fluctuations in the X direction, and these can be clearly associated with the structure/operation of the illustrated holder, which has an intrinsic degree of compliancy (non-stiffness) in X. In a situation where an applied correction is multidimensional, it should be noted that a different (correctional) amplifier gain may be associated with different directions.

A barometric pressure sensor as used in the current invention can be tailor made, or use can be made of a proprietary gas pressure sensor, such as the model FKS-111 sensor marketed by Fuji Ceramics Corporation, Osaka, Japan, for example.

The invention will now be elucidated in more detail on the basis of exemplary embodiments and the accompanying schematic drawings, in which:

FIG. 1 renders a cross-sectional view of an embodiment of a scanning-type charged particle microscope in which the present invention can be enacted.

FIGS. 2A and 2B show various electron microscope images of specimens with a regular crystalline lattice structure, and serve to illustrate the problem underlying the present invention.

FIGS. 3A and 3B give a graphical depiction of the problem underlying the present invention (FIG. 3A) and the effectiveness with which the current invention addresses it (FIG. 3B). The graphs reveal a correlation between beam/specimen positional errors and intermediate-frequency fluctuations in barometric pressure.

FIG. 4A renders a magnified, more-detailed view of (a possible embodiment of) part of a CPM such as that shown in FIGS. 1 and 6, more particularly the specimen holder and associated actuator/stage. FIG. 4B shows the subject of FIG. 4A in the context of an embodiment of the current invention.

FIG. 5A shows an example of a control loop associated with a prior-art microscope. FIGS. 5B and 5C show examples of modifications of the subject of FIG. 5A according to embodiments of the current invention. FIG. 5D illustrates the possible structure of a controller that can be used to enact the current invention.

FIG. 6 renders a cross-sectional view of an embodiment of a transmission-type charged particle microscope in which the present invention can be enacted.

In the Figures, where pertinent, corresponding parts may be indicated using corresponding reference symbols.

EMBODIMENT 1

Figure 1:
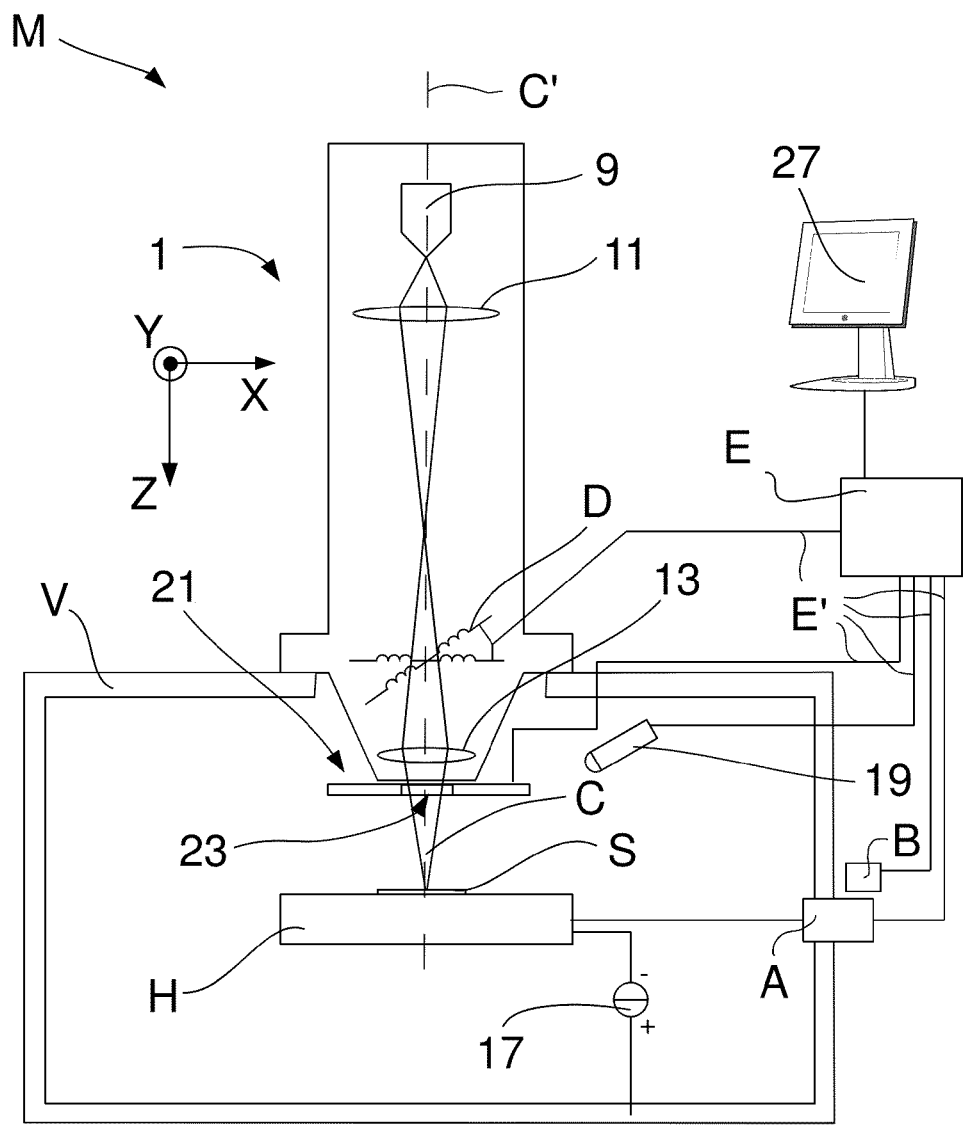

FIG. 1 is a highly schematic depiction of an embodiment of a CPM according to the present invention; more specifically, it shows an embodiment of a scanning-type microscope M, which, in this case, is a SEM (though, in the context of the current invention, it could just as validly be an ion-based microscope, for example). The microscope M comprises a particle-optical column/illuminator 1, which produces a beam C of input charged particles (in this case, an electron beam) that propagates along a particle-optical axis C'. The particle-optical column 1 is mounted on a vacuum chamber V, which comprises a specimen holder H and associated stage/actuator A for holding/positioning a specimen S. The vacuum chamber V is evacuated using vacuum pumps (not depicted). With the aid of voltage source 17, the specimen holder H, or at least the specimen S, may, if desired, be biased (floated) to an electrical potential with respect to ground.

The particle-optical column 1 comprises an electron source 9 (such as a Schottky emitter), lenses 11, 13 to focus the electron beam C onto the specimen S, and a deflection unit D (to perform beam deflection/scanning of the beam C). The apparatus M further comprises a controller/computer processing apparatus E for controlling inter alia the deflection unit D, lenses 11, 13 and detectors 19, 21 and displaying information gathered from the detectors 19, 21 on a display unit 27.

The detectors 19, 21 are chosen from a variety of possible detector types that can be used to examine different types of output radiation flux emanating from the specimen S in response to irradiation by the input beam C. In the apparatus depicted here, the following detector choices have been made:

Detector 19 is a boron-doped solid state detector that is used to detect (at least a portion of) a flux of output electrons emanating from the specimen S;

Detector 21 is a segmented electron detector, comprising a plurality of independent detection segments (e.g. quadrants) disposed about a central aperture 23 (allowing passage of the beam C). Such a detector can, for example, be used to investigate the angular dependence of a flux of output (secondary or backscattered) electrons emerging from the specimen S.

As here rendered, both detectors 19 and 21 are used to examine electrons; however, this is purely a design/implementation choice and, if desired, one could also elect to detect other types of output radiation flux emanating from the specimen S (e.g. X-rays, cathodoluminescence) in addition, or as an alternative, to electrons.

By scanning the input beam C over the specimen S, output radiation—comprising, for example, a flux of X-rays, infrared/visible/ultraviolet light, secondary electrons and or backscattered (BS) electrons—emanates from the specimen S. Since such output radiation is position-sensitive (due to said scanning motion), the information obtained from the detectors 19, 21 will also be position-dependent. This fact allows the output of detector 19 (for instance) to be used to produce (for example) a backscattered electron image of (part of) the specimen S, which image is basically a map of an output of detector 19 as a function of scan-path position on the specimen S.

The signals from the detectors 19, 21 pass along control lines (buses) E', are processed by the controller E, and displayed on display unit 27. Such processing may include operations such as combining, integrating, subtracting, false colouring, edge enhancing, and other processing known to the skilled artisan. In addition, automated recognition processes (e.g. as used for particle analysis) may be included in such processing.

It should be noted that many refinements and alternatives of such a set-up will be known to the skilled artisan, including, but not limited to:

The use of dual beams—for example an electron beam C for imaging and an ion beam for machining (or, in some cases, imaging) the specimen S;

The use of a controlled environment at the specimen S—for example, maintaining a pressure of several mbar (as used in a so-called Environmental SEM) or by admitting gases, such as etching or precursor gases, etc. Although the scanning-type microscope shown in FIG. 1 is a SEM, it could, in the context of the current invention, just as validly be a STEM, for example (see Embodiment 4 below).

Figure 4A:
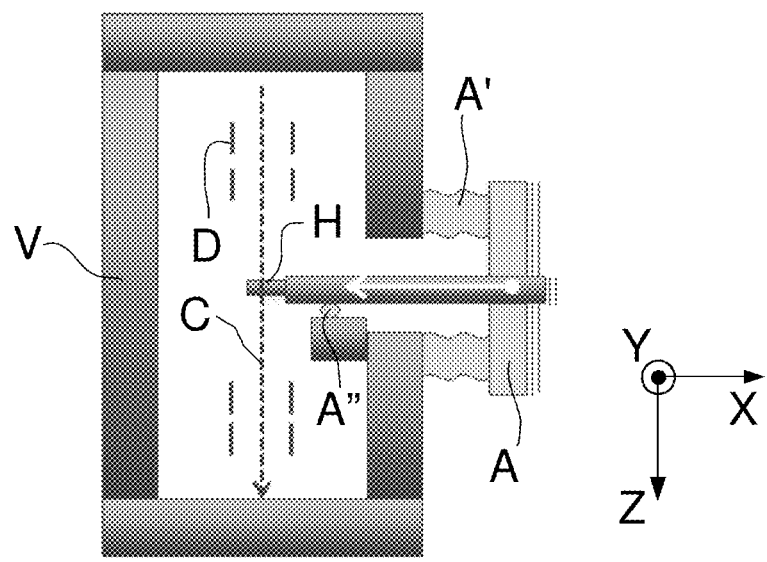

Inter alia to facilitate loading/unloading of the specimen S into and out of the chamber V, the sample holder H and associated stage/actuator A are embodied to (partially) removably protrude through a wall of the chamber V. This set-up is schematically illustrated in greater detail (and not to scale) in FIG. 4A, in which item A' indicates a finite-stiffness member (such as a sealing ring/collar) and item A" represents a support member (bearing). Because part of the composite structure H+A protrudes in this manner outside the enclosure V, it can be influenced by fluctuations in atmospheric pressure outside V, which tend to cause slight shifts in the position of holder H relative to beam C; as here illustrated, such shifts are predominantly parallel to the depicted X axis (as illustrated by the horizontal white arrow), though they may, in principle, also have components in other directions. In the frequency range of interest in the current invention, such positional shifts tend to cause intra-image discontinuities, such as those illustrated in FIGS. 2A and 2B, for example.

Figure 4B:
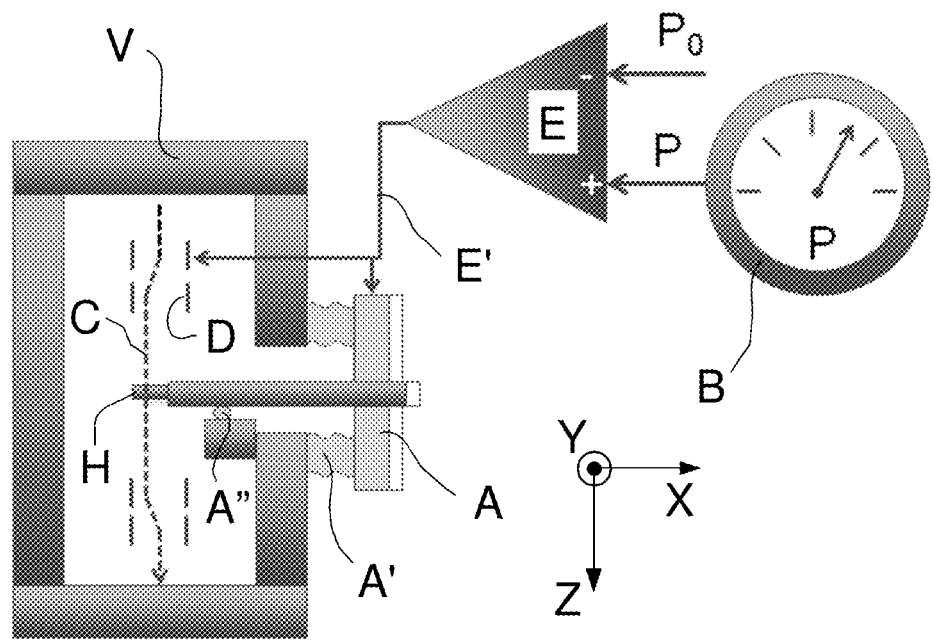

To address this problem, an embodiment of the present invention employs a set-up such as that shown in FIG. 4B. This essentially corresponds to the set-up shown in FIG. 4A, with the addition of a barometric pressure sensor B and automatic (electronic) controller E (here illustrated as a straightforward comparator, for example, which may be just a part of a much more complex (master) controller, or may be a standalone sub-controller, for instance). A pressure measurement signal P from the sensor B is passed to an input of the controller E, which (in this case) compares it to a reference pressure value $P_o$, allowing quantification of a pressure change $\Delta P$ relative to $P_o$ (i.e. $P = P_o + \Delta P$). On the basis of (for example) a prior calibration routine (which determines a conversion factor (scaling factor, sensitivity) S), this pressure change $\Delta P$ can be converted to a corresponding positional shift (error) $\Delta X$ of the holder H using the relationship $\Delta X = S \cdot \Delta P$; for instance, in a specific set-up used by the inventors, S was found to have a value of ca. 15 pm $Pa^{-1}$ (picometers per pascal). Applying a positional compensation/correction $-\Delta X$ will negate the unwanted shift $\Delta X$, restoring the relative position of the beam C and holder H to its nominal value. As here illustrated, this correction is realized by appropriately adjusting a driving signal (voltage or current) to beam deflector D and/or actuator A.

EMBODIMENT 2

Figure 2A:
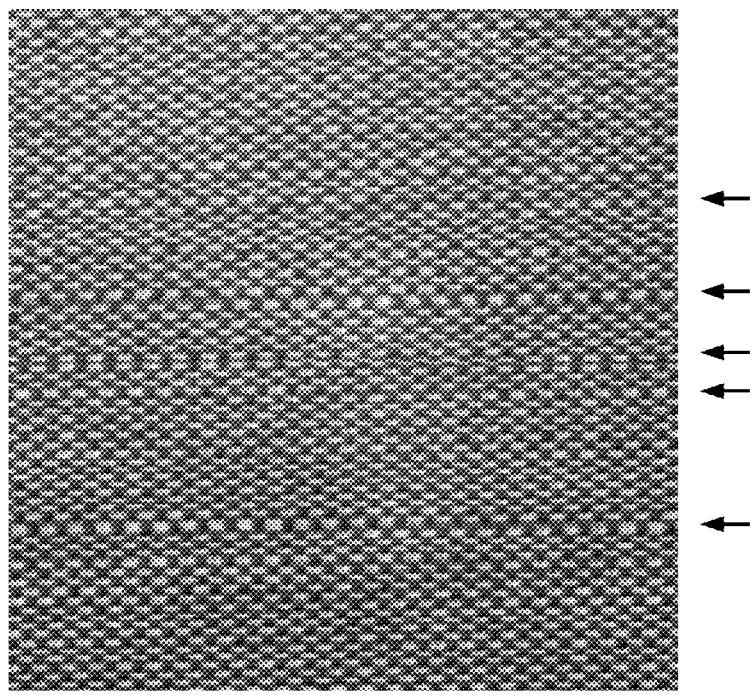
Figure 2B:
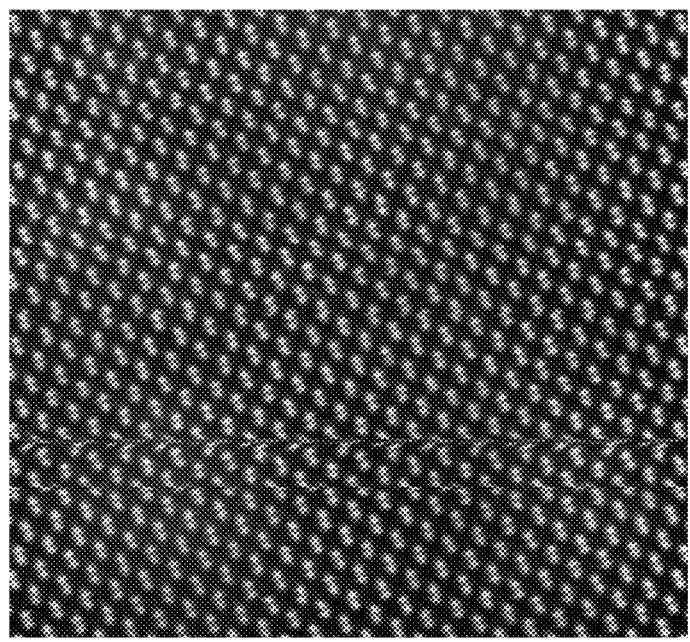

FIGS. 2A and 2B show electron microscope images of specimens with a regular crystalline lattice structure, and serve to illustrate the problem underlying the present invention. More particularly, each of the images pertains to an Si <110> sample thinned to a thickness of ca. 20 nm using FIB milling and viewed using a STEM. FIG. 2A was imaged using an FEI Talos® STEM at a magnification of ca. 5 M× (5 million times), whereas FIG. 2B was imaged using an FEI Titan3® STEM at a magnification of ca. 7 M×. During imaging, a sliding door in an adjacent corridor—separated from each STEM by several tens of meters, and various intervening walls—was opened and closed a number of times. As set forth above, this action caused measurable barometric pressure variations at the location of each STEM, which in turn led to minute but noticeable displacements of the holder on which the specimen was mounted, causing visible discontinuities/jumps in the imaged lattice. Some of these jumps are indicated in FIGS. 2A and 2B using black arrows.

Figure 3A:
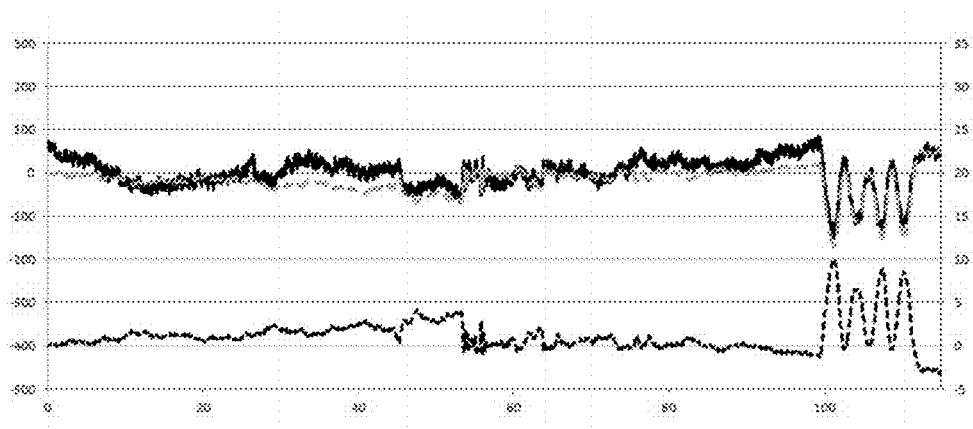
Figure 3B:
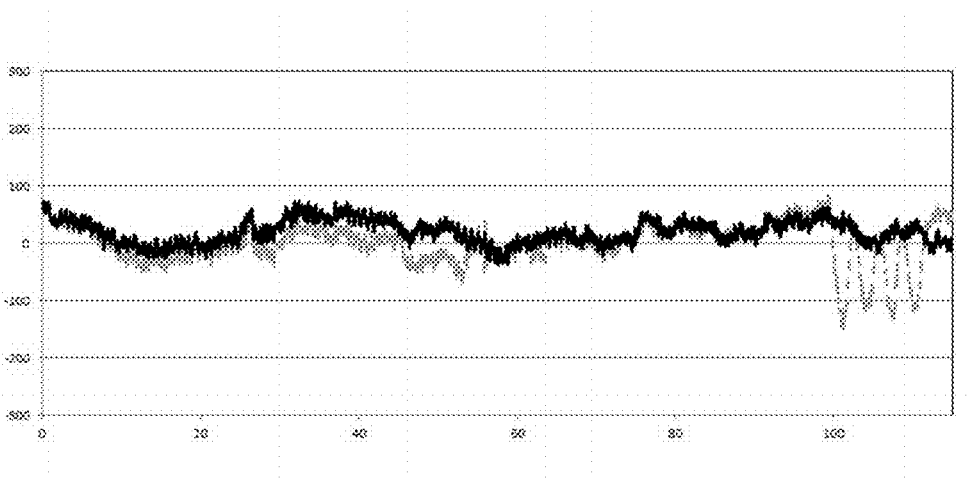

FIGS. 3A and 3B graphically illustrate the phenomenon underlying FIGS. 2A and 2B. In particular:

FIG. 3A shows a correlation between beam/specimen positional errors and intermediate-frequency fluctuations in barometric pressure;

FIG. 3B illustrates the effectiveness with which a control procedure of the current invention can be used to mitigate certain effects of this correlation.

Specific details of FIGS. 3A and 3B have already been discussed above, so a further elucidation will not be given here.

EMBODIMENT 3

Figure 5A:
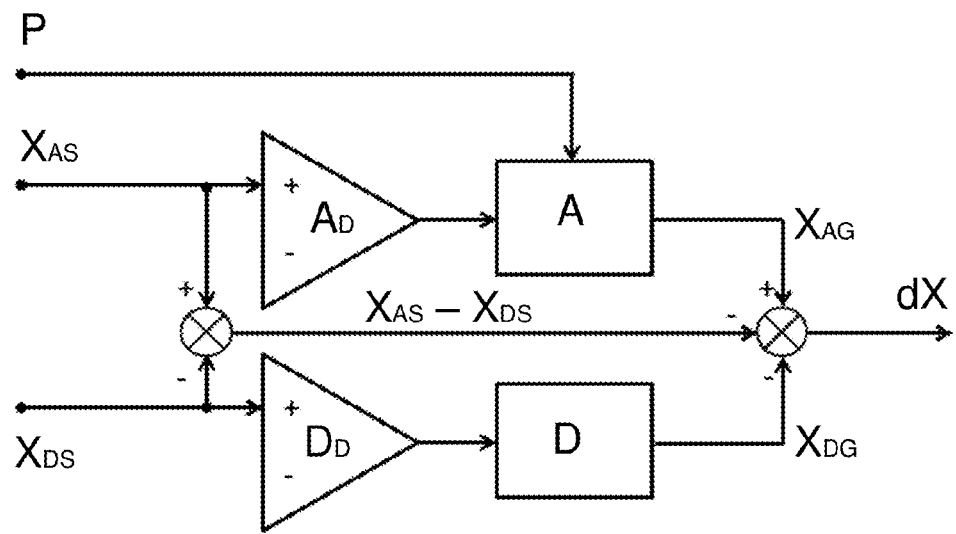
Figure 5D:
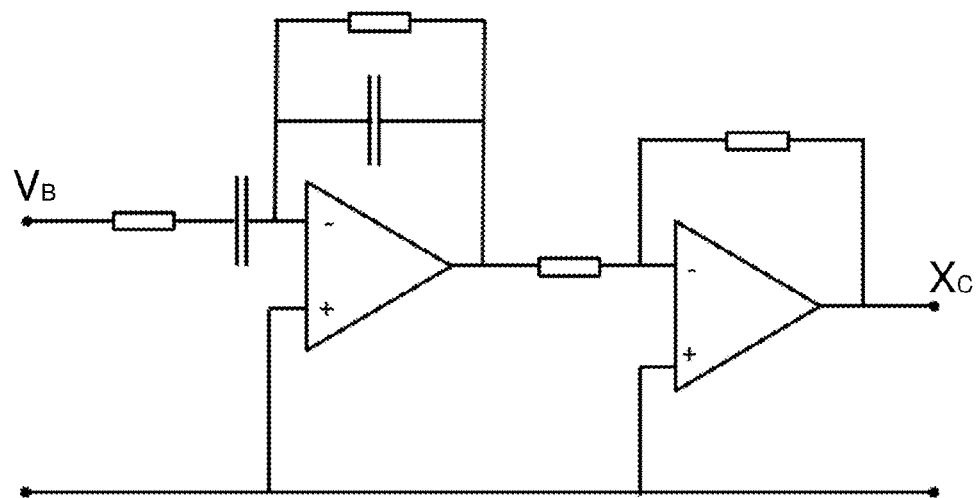
Figure 5B:
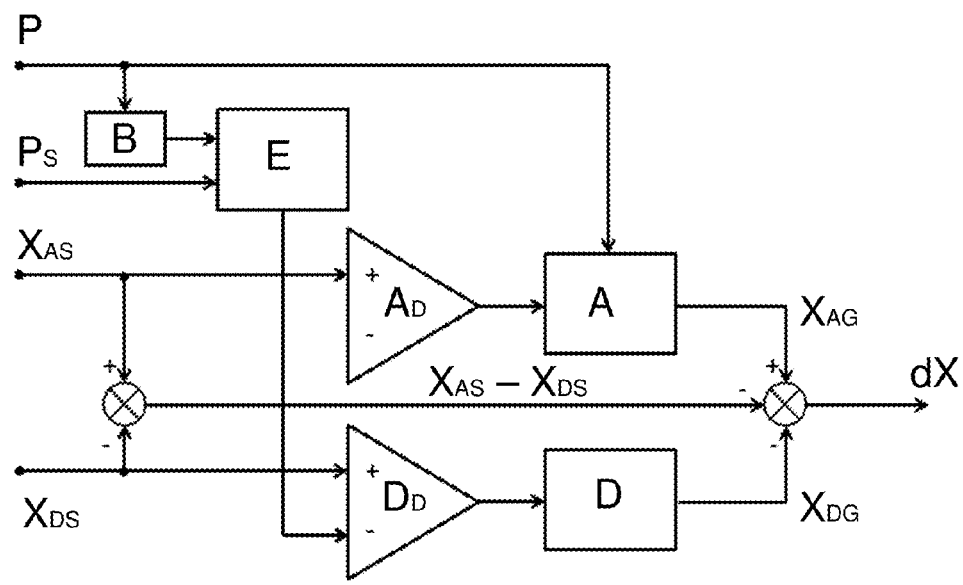
Figure 5C:
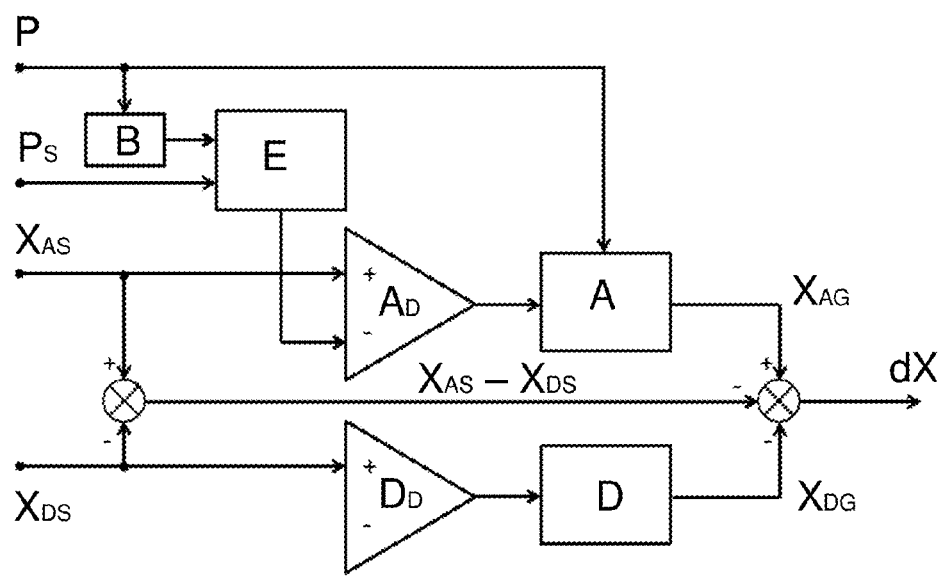

FIG. 5A shows an example of a control loop associated with a prior-art CPM. FIGS. 5B and 5C show examples of modifications of the subject of FIG. 5A according to embodiments of the current invention. FIG. 5D illustrates the possible structure of a controller that can be used to enact the current invention. These Figures will now be discussed in more detail.

FIG. 5A depicts a control schematic for a CPM (e.g. such as that depicted in FIG. 1 or 6) comprising the following items/aspects:

A: Actuator (stage) for holder H.
D: Deflector (system) for employed charged-particle beam.
$A_D$: Driver for A. The input for this driver is positional setpoint $X_{AS}$.
$D_D$: Driver for D. The input for this driver is positional setpoint $X_{DS}$.
P: The influence on A of atmospheric pressure fluctuations.
$X_{AG}$: Obtained position from A.
$X_{DG}$: Obtained position from D.
dX: Positional error.

It is seen that, in this schematic, no attempt is made to compensate for the effect of P.

In FIG. 5B, the schematic of FIG. 5A has been modified so as to compensate for fluctuations in P. The various depicted items/aspects in FIG. 5B correspond to those in FIG. 5A, except for the following:

P is now fed into barometric sensor B, which passes an output to controller E.
$P_S$ is a reference value for P; for example $P_S$ is a "DC" or "background" (meteorological) pressure value on which are superimposed the "AC" or "foreground" pressure fluctuations registered by B. It should be noted that alternative control schemes are possible in which a reference value $P_S$ (or $P_o$ in Embodiment 1 above) is not subtracted from P in the manner shown here; in such schemes, the sensor B may make use of its own (internal) filter(s), for example.
An output from E is passed to driver $D_D$ for D.

This is therefore an embodiment in which compensation according to the invention is applied via the deflector (system) D.

FIG. 5C is identical to FIG. 5B, except in that an output from E is now passed to driver $A_D$ for A, thus yielding an embodiment in which compensation according to the invention is applied via the actuator (stage) A. One could also conceive a hybrid embodiment, in which said compensation is applied via both D and A.

FIG. 5D depicts a possible circuit schematic for a controller E suitable for use in the current invention. The op-amp (operational amplifier) on the left features combined low-pass and high-pass filters as referred to above, thus yielding bandpass filtering that only admits intermediate-frequency pressure fluctuations of interest in the current invention. The op-amp on the right introduces the above-mentioned scaling factor/sensitivity. $V_B$ is a voltage input from barometric sensor B, and $X_C$ is a position correction signal.

EMBODIMENT 4

Figure 6:
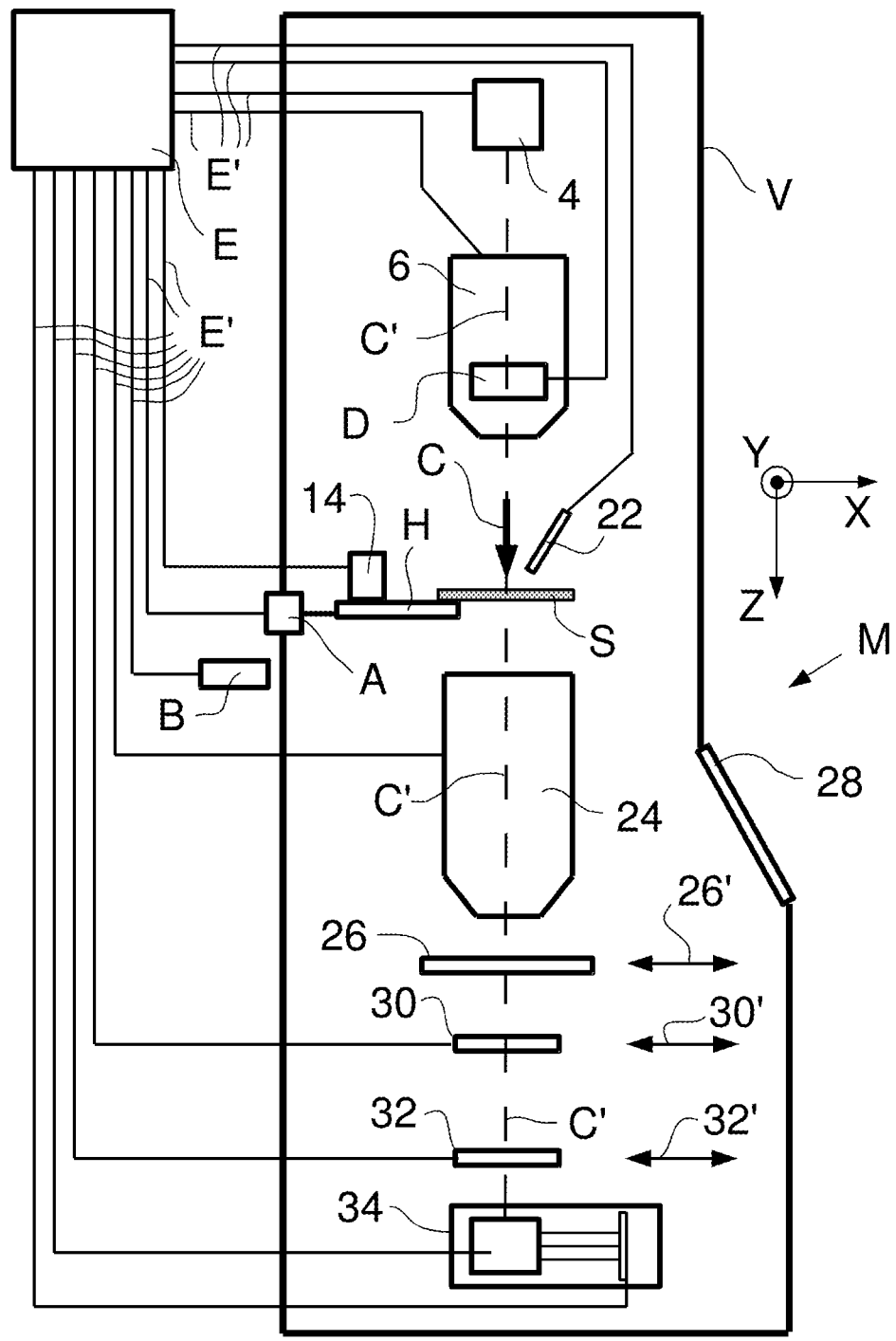

FIG. 6 is a highly schematic depiction of an embodiment of another CPM according to the current invention; more specifically, it shows an embodiment of a transmission-type microscope M, which, in this case, is a TEM/STEM (though, in the context of the current invention, it could just as validly be an ion-based microscope, for example). In the Figure, within a vacuum enclosure V, an electron source 4 (such as a Schottky emitter, for example) produces a beam (C) of electrons that traverse an electron-optical illuminator 6, serving to direct/focus them onto a chosen part of a specimen S (which may, for example, be (locally) thinned/planarized). This illuminator 6 has an electron-optical axis C', and will generally comprise a variety of electrostatic/magnetic lenses, (scan) deflector(s) D, correctors (such as stigmators), etc.; typically, it can also comprise a condenser system (the whole of item 6 is sometimes referred to as "a condenser system").

The specimen S is held on a specimen holder H that can be positioned in multiple degrees of freedom by a positioning device (stage) A; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be irradiated/imaged/inspected by the electron beam traveling along axis C' (in the Z direction) (and/or allows scanning motion to be performed, as an alternative to beam scanning). An optional cooling device 14 is in intimate thermal contact with the specimen holder H, and is capable of maintaining the latter at cryogenic temperatures, e.g. using a circulating cryogenic coolant to achieve and maintain a desired low temperature.

The (focused) electron beam C traveling along axis C' will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the specimen S, emerge (emanate) from it and continue to propagate (substantially, though generally with some deflection/scattering) along axis C'. Such a transmitted electron flux enters an imaging system (combined objective/projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis C'. An image (or diffractogram) of (part of) the specimen S will be formed by imaging system 24 on screen 26, and this may be viewed through viewing port 28 located in a suitable part of a wall of enclosure V. The retraction mechanism for screen 26 may, for example, be mechanical and/or electrical in nature, and is not depicted here.

As an alternative to viewing an image on screen 26, one can instead make use of the fact that the depth of focus of the electron flux emerging from imaging system 24 is generally quite large (e.g. of the order of 1 meter). Consequently, various other types of analysis apparatus can be used downstream of screen 26, such as:

- TEM camera 30. At camera 30, the electron flux can form a static image (or diffractogram) that can be processed by controller E and displayed on a display device (not depicted), such as a flat panel display, for example. When not required, camera 30 can be retracted/withdrawn (as schematically indicated by arrows 30') so as to get it out of the way of axis C'.
- STEM recorder 32. An output from recorder 32 can be recorded as a function of (X,Y) scanning position of the beam C on the specimen S, and an image can be constructed that is a "map" of output from recorder 32 as a function of X,Y. Recorder 32 can comprise a single pixel with a diameter of e.g. 20 mm, as opposed to the matrix of pixels characteristically present in camera 30. Moreover, recorder 32 will generally have a much higher acquisition rate (e.g. $10^6$ points per second) than camera 30 (e.g. $10^2$ images per second). Once again, when not required, recorder 32 can be retracted/withdrawn (as schematically indicated by arrows 32') so as to get it out of the way of axis C' (although such retraction would not be a necessity in the case of a donut-shaped annular dark field recorder 32, for example; in such a recorder, a central hole would allow beam passage when the recorder was not in use).

As an alternative to imaging using camera 30 or recorder 32, one can also invoke spectroscopic apparatus 34, which could be an EELS module, for example (EELS=Electron Energy-Loss Spectroscopy).

It should be noted that the order/location of items 30, 32 and 34 is not strict, and many possible variations are conceivable. For example, spectroscopic apparatus 34 can also be integrated into the imaging system 24.

Note that the controller (computer processor) E is connected to various illustrated components via control lines (buses) E'. This controller E can provide a variety of functions, such as synchronizing actions, providing setpoints, processing signals, performing calculations, and displaying messages/information on a display device (not depicted). Needless to say, the (schematically depicted) controller E may be (partially) inside or outside the enclosure V, and may have a unitary or composite structure, as desired. The skilled artisan will understand that the interior of the enclosure V does not have to be kept at a strict vacuum; for example, in a so-called "Environmental TEM/STEM", a background atmosphere of a given gas is deliberately introduced/maintained within the enclosure V. The skilled artisan will also understand that, in practice, it may be advantageous to confine the volume of enclosure V so that, where possible, it essentially hugs the axis C', taking the form of a small tube (e.g. of the order of 1 cm in diameter) through which the employed electron beam passes, but widening out to accommodate structures such as the source 4, specimen holder H, screen 26, camera 30, recorder 32, spectroscopic apparatus 34, etc.

In the context of the current invention, a barometric pressure sensor B has been provided proximal to (an exterior portion of) actuator A, which—analogous to the situation in FIG. 1 above—(partially) removably protrudes through a wall of enclosure V, inter alia to facilitate loading/unloading of specimen S. This barometric pressure sensor is connected to (a sub-component of) controller E, and can be used to enact the current invention in a matter similar to that set forth in Embodiment 1 and FIGS. 3B, 4B, 5B and 5C above.

EMBODIMENT 5

Variations in environmental pressure can be sub-divided into different categories, such as:

- Slow (low-frequency) variations in atmospheric pressure (e.g. due to (long-term) weather).
- Transient (intermediate-frequency) disturbances in pressure, on a typical timeframe of seconds (e.g. due to wind gusts, opening/closing doors, etc.).
- Acoustic (high-frequency) pressure disturbances, e.g. due to sound.

Typical frequency ranges corresponding to these various causes will be set forth in more detail below.

Of importance in the context of the current invention is the typical time required to capture a single CPM image, which will generally be of the order of about 0.1-100 seconds. A full CPM imaging session can involve the capture of just a single image, but it can alternatively involve the capture of multiple images; for example, some tomography experiments can take several days to complete, requiring capture of many tens or hundreds of images. Drift between consecutive images ("inter image") can, for example, be corrected using real-time drift correction algorithms, or a posteriori cross-correlation software, for instance; in contrast, the current invention is more concerned with degradation of image quality due to pressure variations during the acquisition of a single image ("intra image").

Weather-related pressure—involving changes in atmospheric pressure on a macroscopic scale—generally varies slowly when compared to the duration of typical CPM use cases. Even in calm weather, pressure variations can be of relatively large amplitude (e.g. 25 mbar=2500 Pa), but the variations generally occur on a timescale of hours. Typical weather-related pressure gradients can be of the order of about 1.4 Pa/minute, which is low in relation to the typical duration of image acquisition.

Of greater importance for the operation of a CPM are transient variations in pressure—on a timescale comparable to, or shorter than, the time required to capture an image. Such fluctuations can occur when one opens a door between two areas of different pressure, e.g. as in the case of a door to a cleanroom (which is often at an over-pressure of 10-15 Pa (or more) compared to adjacent areas), or a door to an outside open-air environment. Such pressure changes are typically of temporary duration, and last for the time that the door is opened; to give an example, the current inventors have measured pressure changes of 10-15 Pa—occurring in a transition time of about 1 second—when outside doors are opened for a duration of 3-15 seconds, for instance. In particular, pressure waves can be generated by a hinged door (as opposed to a sliding door), because the swinging motion of a hinged door can mimic properties of a piston or fan: a considerable amount of air can be displaced, leading to a temporary pressure change. The time scale and intensity of such pressure waves depend on a number of factors, such as the speed (related to force and duration) of the door opening, the direction, the surface area of the door, the sizes and shapes of the rooms at either side of the door, their (venting) connections to adjacent areas, etc. It can be shown that typical frequency behavior associated with transient pressure disturbances caused by opening/closing of a hinged door can lie in a range of about 0.01-20 Hz, with a peak-to-peak level of around 3 Pa. Pressure variations caused by door motion can be very annoying, because the induced image displacement is large enough to be noticed, and the time scale is of the same order as the time needed to acquire a single image.

The term "acoustic" refers to the study of mechanical waves in gases, such as ambient air. In this context, the frequency spectrum can be divided into different regions, as follows:

The audio range ("sound")—related to the sensitivity of the human ear—falls between 20 Hz and 20 kHz.

Outside this audio range, there is an ultrasonic range (>20 kHz) and an infrasonic range (<20 Hz).

Using this definition, the low- and intermediate-frequency pressure variations described above can be denoted as infrasound. A CPM can be sensitive to sound up to frequencies of a few kHz. The physical mechanisms by which sound disturbs the CPM's (imaging) performance are different from the mechanisms associated with lower-frequency pressure waves.

Confinement of measurements to a given portion of the frequency spectrum can be realized using appropriate filters. Some examples of such filtering mechanisms will now be discussed.

FILTER EXAMPLE A

Figure 7:
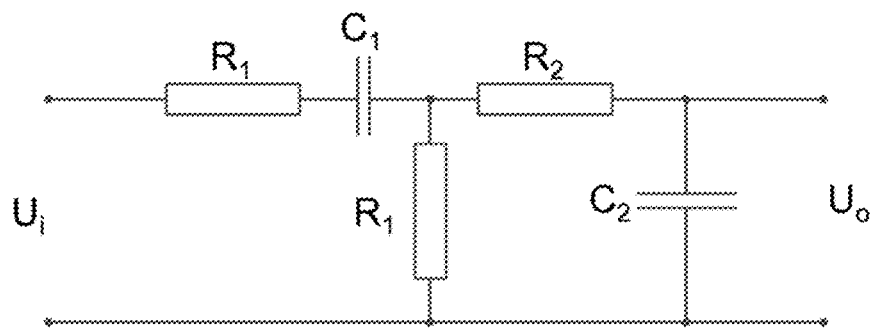
FIG. 7 illustrates an example of an electronic bandpass filter that can be used to select a particular band of frequencies from a signal.

One method of filtering is to use an electronic filter in the signal path—such as a first-order band-pass filter that is embodied to select a range of frequencies related to door opening activities (for example). A schematic drawing of such a filter design is rendered in FIG. 7, which shows a combination of a passive first-order linear high-pass and low-pass filter, in which:

$R_1$ and $R_2$ are electrical resistance values (conventionally, $R_2 \gg R_1$);

$C_1$ and $C_2$ are electrical capacitance values;

$U_i$ and $U_o$ denote input and output potentials, respectively. This filter's high-pass and low-pass cut-off frequencies (−3 dB points) are respectively given by:

$$f_{hp} = \frac{1}{2\pi} \cdot \frac{1}{2 \cdot R_1 \cdot C_1}$$

and $$f_{lp} = \frac{1}{2\pi} \cdot \frac{1}{R_2 \cdot C_2}$$

The following choice of component values will result in a band-pass filter that, for example, selects (passes) the 0.027 Hz-27 Hz frequency band:

$R_1 = 680\Omega$
$C_1 = 4400\ \mu F$
$R_2 = 680\Omega$
$C_2 = 0.88\ \mu F$.

The skilled artisan will be able to select other values so as to achieve a different band-pass window, if so desired.

FILTER EXAMPLE B

Figure 8:
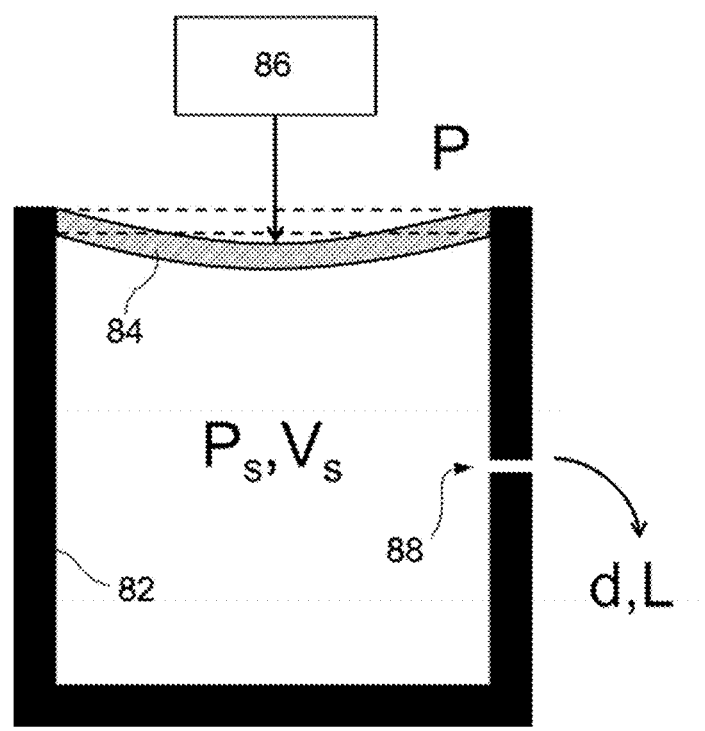
FIG. 8 illustrates an embodiment of a pressure sensor that incorporates a pressure relief duct for filtering out effects of low-frequency pressure variations.

An alternative (and/or supplemental) method of filtering is illustrated in FIG. 8. A pressure sensor can, for example, be embodied to comprise a (rigid) shell/container 82 over which a rubber (or other flexible) membrane 84 has been stretched. In response to changes in environmental pressure, the membrane 84 will deform. A distance sensor 86 (such as an optical encoder, capacitive sensor, etc.) can be used to measure the height at the center of the membrane 84, whereby a registered change in height is proportional to the difference in pressure between the (outside) environment and interior of the shell 82. If a small opening (duct) 88 is intentionally created between the interior of the shell 82 and the environment, air will be allowed to flow into and out of the shell 82 through this opening 88. If the opening 88 is small enough, the response to environmental pressure variations will be slow, and the effect on the sensor will be that of a high-pass filter. This can be further elucidated as follows.

Assume a closed vessel of volume $V_s$ filled with air at pressure $P_s$. A small cylindrical opening (or pipe) of diameter d and length L connects the interior of the vessel with the environment. Assume the volume of the vessel is constant, $V_s(t) = V_0$ (isochoric process). Furthermore, assume that the pressure-changing process is isothermal, which is a valid assumption for laminar flow, low-pressure differences, and slow response. Let the environmental pressure P vary around the atmospheric pressure $P_0$ of 1 bar ($10^5$ Pa). The pressure difference between the environment and the vessel will cause air to flow into/out of the vessel through the opening. This flow is described by the Hagen-Poiseuille equation:

$$Q = \frac{\pi d^4}{128 \eta L} \cdot \Delta P = C_r \cdot \Delta P$$

where Q is the volumetric flow rate (in m³/s), ΔP is the pressure difference between vessel and environment (P−$P_s$), d and L are the diameter and length of the opening, respectively, η is the dynamic viscosity of air and Cr is the conductivity of the pipe.

The change in volume of gas in the vessel in an infinitesimally small time dt will lead to a pressure change $dP_s$ given by:

$$dP_s = \frac{dV_g}{V_0} \cdot P_0 = \frac{Q \cdot dt}{V_0} \cdot P_0$$

If one inserts the Hagen-Poiseuille equation for Q, one obtains:

$$\frac{dP_s}{dt} = \frac{Q}{V_0} \cdot P_0 = \frac{C_r \cdot \Delta P}{V_0} \cdot P_0 = \frac{C_r}{V_0} \cdot P_0 \cdot (P - P_s)$$

which can be re-written as:

$$\frac{V_0}{C_r \cdot P_0} \cdot \frac{dP_s(t)}{dt} + P_s(t) = P(t)$$

Note that this equation is equivalent to the linear differential equation of an electrical RC circuit:

$$RC \cdot \frac{dV_{out}(t)}{dt} + V_{out}(t) = V_{in}(t)$$

where R is resistance, C is capacitance, and $V_{in}$ and $V_{out}$ are the input and output voltages of the RC filter.

In analogy with the RC filter, the reponse of the pressure vessel with leak is:

$$G_p = \left|\frac{P_s}{P}\right| = \frac{1}{\sqrt{1+\left(\omega\frac{V_0}{C_r \cdot P_0}\right)^2}}$$

It is thus seen that the leak has the function of a low-pass filter, and that it allows the pressure within the vessel to slowly adapt to the environment. Note that a pressure sensor based on such a pressure vessel would give an output signal that is proportional to the difference between environmental pressure and internal pressure; consequently, the response of the sensor is of a high-pass type:

$$G_s = \left|\frac{P-P_s}{P}\right| = \frac{1}{\sqrt{1+1/\left(\omega\frac{V_0}{C_r \cdot P_0}\right)^2}}$$

which has its cutoff frequency (−3 dB point) at:

$$f_{-3dB} = \frac{1}{2\pi}\frac{C_r \cdot P_0}{V_0}$$

The consideration above replaced the membrane 84 of FIG. 8 by a rigid wall. Introducing now a parameter A with values A=0 for a rigid wall and A=1 for a very compliant membrane, one obtains:

$$f_c(A) = (1-A)f_c(A=0)$$

for cutoff frequency $f_c$. In practice, the inventors found A≥0.86 to give a realistic representation of the membrane behavior.

The following choice of parameters:
$V_0$=3.5 liter
L=10 mm
D=0.4 mm
A=0.86 results in a cutoff frequency of 0.0022 Hz, which is suitable to suppress weather-related pressure changes, but let through pressure variations due to door opening and closing activities, for instance.

Once again, the skilled artisan will be able to select other values so as to achieve a different cutoff frequency, if so desired.

The invention claimed is:

1. A method of using a Charged Particle Microscope, comprising:
providing a specimen on a specimen holder;
directing a beam of charged particles from a source through an illuminator so as to irradiate the specimen;
using a detector to detect a flux of radiation emanating from the specimen in response to said irradiation,
providing the microscope with a barometric pressure sensor;
providing an automatic controller with a pressure measurement signal from said barometric pressure sensor; and
invoking said controller to use said signal as input to a control procedure, to compensate for a relative positional error of said beam and said specimen holder on the basis of said signal.

2. A method according to claim 1, wherein:
said control procedure comprises a control loop;
said compensation comprises on-the-fly adjustment of a relative position of said beam and said specimen holder.

3. A method according to claim 2, wherein:
the specimen holder is provided with an actuator mechanism that can be used to adjust a position of the holder;
the controller is invoked to adjust a position setpoint supplied to said actuator mechanism in response to said signal.

4. A method according to claim 2, wherein:
the illuminator is provided with a deflector mechanism that can be used to adjust a deflection of the beam;
the controller is invoked to adjust a deflection setpoint supplied to said deflector mechanism in response to said signal.

5. A method according to claim 2, wherein:
the microscope is provided with an imaging system, for directing a flux of charged particles transmitted through the specimen onto said detector;
the imaging system is provided with a steering module that can be used to adjust a path of said flux;
the controller is invoked to adjust a steering setpoint supplied to said steering module in response to said signal.

6. A method according to claim 1, wherein:
the microscope is provided with scanning means, for producing relative scanning motion of the beam and specimen;
the controller is invoked to construct a table of detector output as a function of scan coordinate position on the specimen;
the compensation comprises retrospective correction of said scan coordinate position on a point-by-point basis.

7. A method according to claim 1, wherein use is made of a filter to discount at least one of the following:
effects of relatively low-frequency pressure variations associated with weather phenomena;
effects of relatively high-frequency pressure variations associated with acoustic phenomena.

8. A method according to claim 7, wherein said filter has at least one cutoff point selected from the group comprising:
a low-frequency cutoff point in the range 0.0001-0.1 Hz;
a high-frequency cutoff point in the range 8-100 Hz.

9. The method of claim 8, wherein the low-frequency cutoff point is in the range of 0.001-0.1 Hz and the high-frequency cutoff point is in the range of 8-50 Hz.

10. The method of claim 8, wherein the low-frequency cutoff point is in the range of 0.01-0.1 Hz and the high-frequency cutoff is in the range of 10-30 Hz.

11. A method according to claim 7, wherein said filter passes frequencies associated with pressure waves resulting from opening or closing of a door in a wall of an enclosure in which the microscope is housed.

12. A method according to claim 7, wherein said filter is selected from the group comprising:
an electronic RC circuit in a signal path from the pressure sensor;
a pressure relief duct in a wall of the pressure sensor, and combinations hereof.

13. A Charged Particle Microscope, comprising:
a specimen holder, for holding a specimen;

a source, for producing a beam of charged particles;

an illuminator, for directing said beam so as to irradiate the specimen;

a detector, for detecting a flux of radiation emanating from the specimen in response to said irradiation;

an automatic controller, and;

an input interface from a barometric pressure sensor, which can supply a pressure measurement signal to said controller;

said controller programmed to use said signal as input to a control procedure, to compensate for a relative positional error of said beam and said specimen holder on the basis of said signal.

14. The charged particle microscope of claim 13, wherein:

the specimen holder is provided with an actuator mechanism that can be used to adjust a position of the holder; and the controller is programmed to adjust a position setpoint supplied to said actuator mechanism in response to said signal.

15. The charged particle microscope of claim 13, wherein the barometric sensor is located proximal to an externally protruding portion of the specimen holder.

16. The charged particle microscope of claim 13, wherein the barometric sensor is mounted on an exterior surface of the microscope.

17. The charged particle microscope of claim 13, wherein the barometric sensor is located distant to the microscope, said barometric sensor location experiencing substantially the same barometric conditions as the microscope.

18. The charged particle microscope of claim 13, wherein the barometric sensor is shared by a plurality of microscopes.

19. The charged particle microscope of claim 13, wherein the illuminator is provided with a deflector mechanism that can be used to adjust a deflection of the beam; and the controller is invoked to adjust a deflection setpoint supplied to the deflector mechanism in response to said signal.

20. The charged particle microscope of claim 13, wherein the microscope further comprises:

an imaging system, for directing a flux of charged particles transmitted through the specimen onto said detector;

the imaging system is provided with a steering module that can be used to adjust a path of said flux; and the controller is invoked to adjust a steering setpoint supplied to the steering module in response to said signal.

\* \* \* \* \*